United States Patent
Kawano et al.

(10) Patent No.: US 9,102,541 B2
(45) Date of Patent: Aug. 11, 2015

(54) CARBON MATERIAL COVERED WITH DIAMOND THIN FILM AND METHOD OF MANUFACTURING SAME

(75) Inventors: Takanori Kawano, Osaka (JP); Rie Tao, Osaka (JP)

(73) Assignee: TOYO TANSO CO., LTD., Osaka (JP)

( * ) Notice: Subject to any disclaimer, the term of this patent is extended or adjusted under 35 U.S.C. 154(b) by 326 days.

(21) Appl. No.: 13/260,065

(22) PCT Filed: Mar. 19, 2010

(86) PCT No.: PCT/JP2010/054768
§ 371 (c)(1),
(2), (4) Date: Dec. 14, 2011

(87) PCT Pub. No.: WO2010/110196
PCT Pub. Date: Sep. 30, 2010

(65) Prior Publication Data
US 2012/0094117 A1   Apr. 19, 2012

(30) Foreign Application Priority Data

Mar. 23, 2009 (JP) ................................ 2009-070037

(51) Int. Cl.
*B32B 9/00*    (2006.01)
*C01B 31/06*   (2006.01)
(Continued)

(52) U.S. Cl.
CPC ............. *C01B 31/06* (2013.01); *C23C 16/0272* (2013.01); *C23C 16/271* (2013.01); *C23C 16/277* (2013.01); *Y10T 428/273* (2015.01)

(58) Field of Classification Search
None
See application file for complete search history.

(56) References Cited

U.S. PATENT DOCUMENTS 5,051,785 A * 9/1991 Beetz et al. ................. 257/77
5,071,708 A * 12/1991 Komaki et al. ............. 428/403
5,082,359 A * 1/1992 Kirkpatrick ................. 359/642
(Continued)

FOREIGN PATENT DOCUMENTS

JP          5-345697 A    12/1993
JP      2004-332108 A    11/2004
(Continued)

OTHER PUBLICATIONS

Chinese Office Action dated Mar. 28, 2013, issued in corresponding Chinese Patent Application No. 201080010924.X, w/ English translation.
(Continued)

*Primary Examiner* — Humera Sheikh
*Assistant Examiner* — Seth Dumbris
(74) *Attorney, Agent, or Firm* — Westerman, Hattori, Daniels & Adrian, LLP (57) ABSTRACT

A carbon material and a method of manufacturing the carbon material are provided. By affixing diamond particles onto a carbonaceous substrate in a condition in which etching caused by hydrogen radicals is unlikely to occur, the substrate etching rate can be suppressed, and the carbon material is allowed to have a diamond thin film having excellent adhesion capability. The carbon material has a carbonaceous substrate showing a weight decrease under a diamond synthesis condition, diamond particles disposed on a surface of the carbonaceous substrate, and a diamond layer having the diamond particles as seeds. The weight of the diamond particles per unit area is set to from $1.0 \times 10^{-4}$ g/cm$^2$ to less than $3.0 \times 10^{-3}$ g/cm$^2$.

16 Claims, 3 Drawing Sheets

(51) Int. Cl.
*C23C 16/02* (2006.01)
*C23C 16/27* (2006.01)

(56) References Cited

U.S. PATENT DOCUMENTS

| | | | | |
|---|---|---|---|---|
| 5,614,272 | A * | 3/1997 | Shah | 427/560 |
| 5,698,328 | A * | 12/1997 | Bunshah et al. | 428/408 |
| 6,068,883 | A * | 5/2000 | Deguchi et al. | 427/249.12 |
| 6,270,898 | B1 * | 8/2001 | Yamamoto et al. | 428/408 |
| 8,282,796 | B2 * | 10/2012 | Tao et al. | 204/294 |
| 2004/0206624 | A1 | 10/2004 | Hosonuma et al. | |
| 2005/0079359 | A1* | 4/2005 | Fujita et al. | 428/408 |
| 2005/0181131 | A1* | 8/2005 | Linares et al. | 427/249.8 |
| 2009/0226718 | A1* | 9/2009 | Hasegawa et al. | 428/338 |

FOREIGN PATENT DOCUMENTS

| | | |
|---|---|---|
| JP | 2005-224902 A | 8/2005 |
| JP | 2007-277088 A | 10/2007 |
| WO | 2007/004647 A1 | 1/2007 |

OTHER PUBLICATIONS

International Search Report of PCT/JP2010/054768, mailing date Jun. 8, 2010.

Japanese Office Action dated Jul. 31, 2013, issued in corresponding Japanese Patent Application No. 2009-070037 with English translation (11 pages).

* cited by examiner

CARBON MATERIAL COVERED WITH DIAMOND THIN FILM AND METHOD OF MANUFACTURING SAME

TECHNICAL FIELD

The present invention relates to a carbon material in which a diamond thin film is synthesized on a carbonaceous substrate, and a method of manufacturing the carbon material.

BACKGROUND ART

Diamond has remarkable characteristics in terms of, for example, strength, thermal conductivity, and chemical resistance, and it is a material with very high potential for applications in mainly industrial materials in which such physical properties can be utilized. CVD diamond has long been known since the discovery of the deposition technique, and it has already been used widely in various industrial application fields, from the uses for cutting and grinding processes to various components including heat dissipating boards (for electronic circuit components), sensors (used in severe environments), optical window materials, detectors (for particle physics experiments), and speaker diaphragms. It is expected that the uses will expand more and more in the future.

The techniques for fabricating diamond for industrial uses can be classified roughly into two techniques, high-pressure synthesis and chemical vapor deposition. The former is the technique in which graphite, for example, serving as the carbon source that is the source material of diamond, is converted into diamond by applying high temperature and high pressure. This technique imitates the generation of diamond in nature. The latter is the technique in which a source material originating from carbon, the constituent element of diamond, is put into a gas state, is then subjected to chemical reactions such as excitation and decomposition with the use of electromagnetic waves or a heating element, and is restructured on a substrate into diamond.

Typical examples of the just-mentioned chemical vapor deposition technique include a plasma CVD (Plasma-assisted Chemical Vapor Deposition) technique, a hot filament CVD (HFCVD: Hot Filament Chemical Vapor Deposition) technique, and a chamber flame method. The differences between these techniques are that these techniques use different means of decomposition and excitation of molecules in vapor phase space, namely, electrons, ions, and radical species in plasma, a heating element, or thermal energy. That is, the ways of imparting energy are different.

The diamond synthesized by the foregoing techniques is formed in a film-like shape, and the diamond is obtained in such a form that the surface shape of the cover material is transferred thereto. By selecting the type of the source material gas, impurities such as boron, phosphorus, and nitrogen can be contained (doped) in the film. The film in which these elements are introduced shows semiconductor-like behaviors electrically, and as the content of the impurity increases, the characteristics of the film change into those of a conductor.

In depositing CVD diamond on various types of carbonaceous substrates, there is a difference in thermal expansion coefficient between the substrate and the CVD diamond layer. If there is an excessive difference in thermal expansion coefficient, the CVD diamond layer is compressed to the substrate or is put under stress in a stretching direction during the cooling process after the deposition and preparation, so the CVD diamond layer may be peeled off.

Conventionally, various techniques to solve this problem have been investigated. In an example, mechanical anchoring of the diamond layer is effected by roughening the substrate surface as a technique of increasing the adhesiveness between the CVD diamond layer and the substrate. For example, Patent Document 1 describes a method of forming a diamond layer on a substrate by a CVD technique, in which a substrate surface is roughened by a blasting process and a film is formed by a CVD technique on the resulting roughened surface. By this method, the film is formed in such a manner that the roughened surface is transferred thereto, whereby the contact area is increased. At the same time, the film is anchored to the substrate in such a manner that wedges are pushed into the film, whereby the adhesiveness between the film and the substrate is increased. The process according to this method can prevent peeling and cracks resulting from the contraction and expansion of the film due to the thermal expansion coefficient difference between the film and the substrate. This process is practiced as a very useful surface treatment technique.

CITATION LIST

Patent Documents

[Patent Document 1]
Japanese Published Unexamined Patent Application No. 2005-224902 A

SUMMARY OF THE INVENTION

Problems to be Solved by the Invention

However, the diamond thin film synthesis on a carbonaceous substrate by CVD uses hydrogen as a source material. For this reason, etching caused by activated hydrogen radicals takes place at the substrate surface in parallel with diamond generation. Because of this phenomenon, not only the substrate surface is etched, but also soot is produced. As a consequence, the adhesion between the carbonaceous substrate and the diamond thin film becomes poor, and peeling still occurs.

In view of this, it is an object of the present invention to provide a carbon material having a diamond thin film that can suppress the substrate etching rate and offers good adhesion capability by affixing diamond particles, which are unlikely to be affected by the etching caused by hydrogen radicals, to a carbonaceous substrate, and to provide a method of manufacturing the carbon material.

Means for Solving the Problems

In order to accomplish the foregoing object, the present invention provides a carbon material comprising: a carbonaceous substrate, diamond particles disposed on a surface of the carbonaceous substrate, and a diamond layer comprising the diamond particles as seeds, characterized in that: the weight of the diamond particles per unit area is from $1.0 \times 10^{-4}$ g/cm$^2$ to less than $3.0 \times 10^{-3}$ g/cm$^2$.

Diamond particles are unlikely to be affected by the etching caused by hydrogen radicals. Therefore, when diamond particles are disposed on the carbonaceous substrate and then a diamond layer having the diamond particles as seeds is formed, the etching rate of the carbonaceous substrate is suppressed, and thereby, a diamond layer having good adhesion capability is formed on the surface of the carbonaceous substrate.

The weight of the diamond particles per unit area is restricted to be within the foregoing range for the following reason. When the just-mentioned weight is less than $1.0\times10^{-4}$ g/cm$^2$, the amount of the diamond particles is so small that the advantageous effects obtained by disposing diamond particles on the carbonaceous substrate surface cannot be obtained fully. On the other hand, if the just-mentioned weight is $3.0\times10^{-3}$ g/cm$^2$ or greater, adhesiveness between the diamond thin film and the carbonaceous substrate cannot be obtained, so the diamond thin film may peel off.

It is desirable that the weight of the diamond particles per unit area be equal to or greater than $2.3\times10^{-4}$ g/cm$^2$.

This restriction can serve to inhibit the weight of the carbonaceous substrate from decreasing after the formation of the diamond layer and also at the same time prevent the diamond layer from peeling from the carbonaceous substrate.

It is desirable that the diamond particles have crystallinity, a lattice constant of 0.36 nm or less as determined by XRD, and a cluster distribution of from 0.003 μm to 10 μm.

The lattice constant is restricted to 0.36 nm or less because if the lattice constant exceeds this value, the crystallinity of the diamond is poor and the adverse effects caused by the etching resulting from hydrogen radicals are likely to occur. The cluster distribution is restricted to 0.003 μm or greater because the diamond particles of less than 0.003 μm may undergo a convective flow within the chamber under a chemical vapor deposition atmosphere because of the flow of the gas. On the other hand, the cluster distribution is restricted to 10 μm less because if it exceeds 10 μm, the adhesion capability to the carbonaceous substrate becomes poor.

It is desirable that the carbonaceous substrate show a weight decrease of −4.0% or less when solid in a diamond synthesis atmosphere. It is also desirable that: the carbonaceous substrate comprise a carbonaceous substance comprising a unary or binary source material; the carbonaceous substrate have an X-ray diffraction pattern such that (002) diffraction line shapes appearing at 2θ=10° to 30° are asymmetrical; and the (002) diffraction line shapes have a two-line component pattern having at least two diffraction lines at about 2θ=26° and at a lower angle than about 26°. Moreover, it is desirable that the carbonaceous substrate have a crystallite size of from 2 nm to 32 nm as determined from the diffraction line at a lower angle than about 26°.

It is desirable that the diamond layer contain at least one electrical conductivity-imparting element selected from the group consisting of nitrogen, boron, and phosphorus, and that the diamond layer have an electrical resistance of $1\times10^{-3}$ Ω·cm or higher.

It is necessary that the source gas concentration ratio B (boron)/C (carbon) exceed 10000 ppm in order to fabricate a diamond layer having an electrical resistance of less than $1\times10^{-3}$ Ω·cm, which is difficult with the current apparatus performance. Also, excessive dopant can hinder the formation of the diamond layer by crystal growth considerably. For these reasons, it is desirable that the electrical resistance be restricted as described above. This also applies to nitrogen and phosphorus, not only to boron.

A method of manufacturing a carbon material of the present invention is characterized by comprising the steps of: preparing diamond particles; disposing the diamond particles on a surface of a carbonaceous substrate so that the weight of the diamond particles per unit area is from $1.0\times10^{-4}$ g/cm$^2$ to less than $3.0\times10^{-3}$ g/cm$^2$; and forming a diamond layer comprising the diamond particle as seeds by a chemical vapor deposition technique.

This method makes it possible to manufacture the above-described carbon material.

In the diamond synthesis by a high-pressure synthesis technique, the diamond serving as a seed is unnecessary, but it is difficult to synthesize a large-sized diamond, with a maximum of several millimeters. On the other hand, in the diamond synthesis by a chemical vapor deposition technique, it is possible to synthesize diamond on a large-sized substrate, but the diamond serving as a seed is necessary from the viewpoints of deposition speed and manufacturing costs. It is also possible to prepare diamond particles by pulverizing the obtained diamond thin film. Thus, by preparing diamond particles, disposing the diamond particles on a surface of a carbonaceous substrate, and thereafter forming a diamond layer by a chemical vapor deposition technique as in the above-described manner, the adhesion capability between the carbonaceous substrate and the diamond layer can be maintained and at the same time the diamond can be fabricated smoothly over a wide area. It should be noted that the weight of the diamond particles per unit area is restricted to be from $1.0\times10^{-4}$ g/cm$^2$ to less than $3.0\times10^{-3}$ g/cm$^2$ for the reasons already mentioned.

In the step of forming the diamond particles on a surface of a carbonaceous substrate, the diamond particles may be disposed by affixing using ultrasonic waves (ultrasonic method) or by a spraying method, using a solution in which diamond particles are dispersed. However, it is more desirable to employ a spraying method.

Examples of the solution in which diamond particles are dispersed include: alcohols, such as ethanol, butanol, and isopropanol; acetonitrile; water; pure water; and polyvinyl alcohol solutions. It is preferable to use ethanol, which can remove the solvent at low temperature and can disperse diamond particles relatively easily.

With the above-described method, a diamond particle layer can be easily formed on the surface of the carbonaceous substrate, and moreover, good adhesiveness between the carbonaceous substrate and the diamond thin film can be maintained.

Advantages of the Invention

In the present invention, diamond particles are affixed to a carbonaceous substrate in a condition in which the substrate is unlikely to be affected by the etching caused by hydrogen radicals. Thereby, the present invention provides a carbon material having a diamond thin film that can suppress the substrate etching rate and offers good adhesion capability. The invention also provides a method of manufacturing the carbon material.

DESCRIPTION OF EMBODIMENTS

First, diamond particles (average secondary particle diameter: 1 μm) were prepared by a high-pressure synthesis technique. Thereafter, an ethanol solution in which the resultant diamond particles were dispersed at a concentration of 1.0 wt. % was prepared. Then, using an ultrasonic method, diamond particles were affixed to a carbonaceous substrate. At that time, the weight of the diamond particles (diamond seed crystals) on the substrate surface per unit area was $2.3 \times 10^{-4}$ g/cm$^2$.

Next, using a hot filament CVD method, a diamond layer having the just-described diamond particles as seeds was formed under the following conditions.

Filament type: Tungsten
Filament temperature: 2400° C.
Source gas: hydrogen gas, methane gas, and trimethylboron gas (The methane gas and trimethylboron gas were introduced so that the ratio B [boron]/C [carbon]=1000 ppm.)
Furnace internal pressure: 50 Torr
Process time: 11 hours The resultant diamond thin film (i.e., the diamond layer) was analyzed by Raman spectrometry. As a result, it was observed that a peak originating from diamond was observed at 1333 cm$^{-1}$. In addition, the resultant diamond thin film was observed by SEM. As a result, it was found that the substrate surface was covered with the diamond thin film, and that the diamond thin film was a polycrystalline film comprising diamond particles having automorphism with a particle size of about 1 µm.

EXAMPLES

Hereinbelow, the present invention will be described in further detail based on examples thereof. However, the present invention is not limited by the description of the following examples.

[Carbonaceous Substrates Used in the Following Examples and Comparative Examples]

Table 1 below shows the crystallite sizes of the carbonaceous substrates used in the following examples and comparative examples. Each of carbonaceous substrates I to V comprises a carbonaceous substance comprising a unary or binary source material. Each of carbonaceous substrates I to V has an X-ray diffraction pattern such that (002) diffraction line shapes appearing at 2θ=10° to 30° are asymmetrical, and the (002) diffraction line shapes have a two-line component pattern having at least two diffraction lines at about 2θ=26° and at a lower angle than about 26°.

TABLE 1

| Substrate | Crystallite size of carbonaceous substance and graphite as determined from (002) diffraction line at a lower angle than about 26° in XRD (nm) | Weight change of carbonaceous or graphite substrate (%) |
| --- | --- | --- |
| Carbonaceous substrate I | 2.6 | −3.81 |
| Carbonaceous substrate II | 2.3 | −3.01 |
| Carbonaceous substrate III | 17.1 | −0.81 |
| Carbonaceous substrate IV | 19.8 | −0.70 |
| Carbonaceous substrate V | 31.3 | −0.02 |

Figure 1:
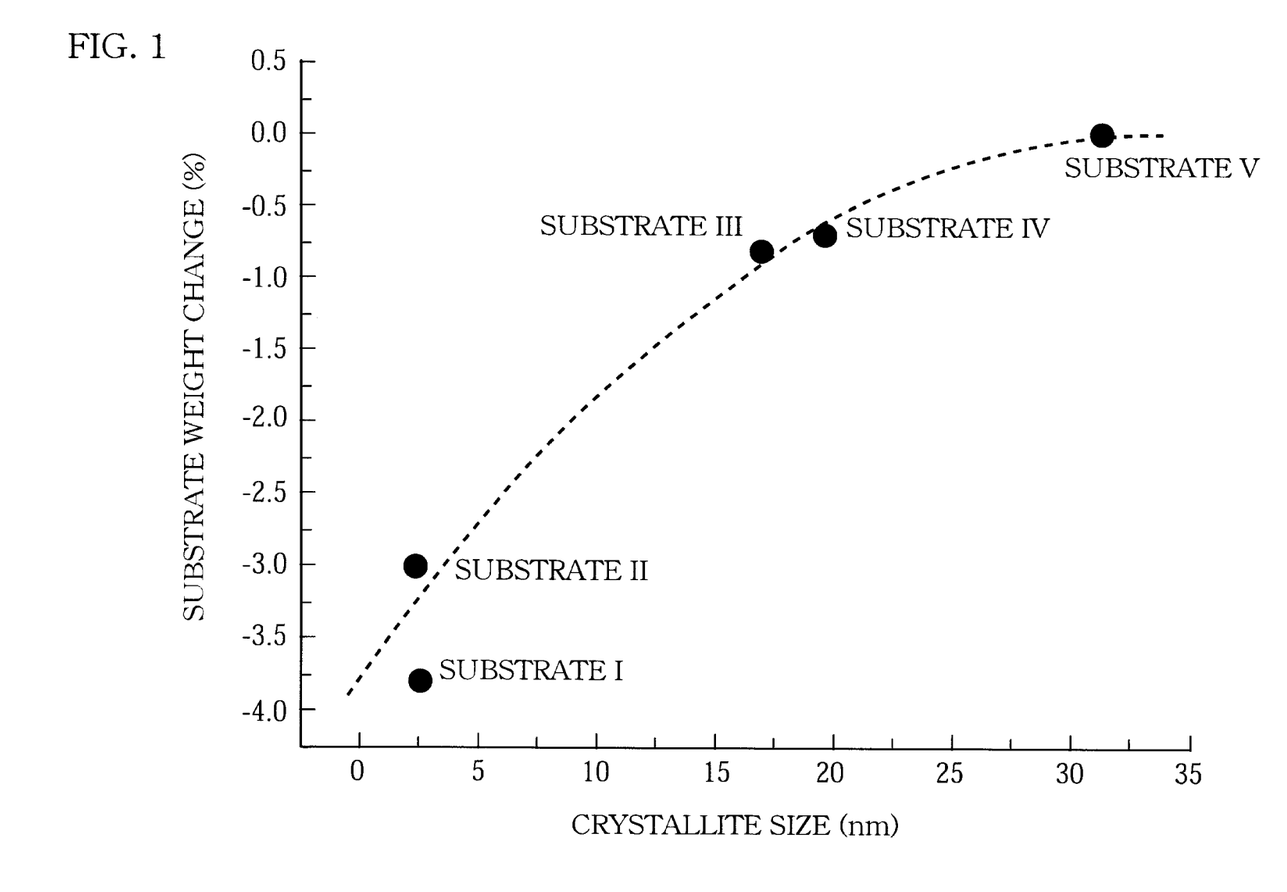
FIG. 1 is a graph showing the relationship of the weight decrease rate of a carbonaceous substrate under a diamond synthesis condition with respect to the crystallite size of the carbonaceous substrate as determined from a diffraction line at a lower angle than about 26°.

FIG. 1 shows the weight change ratios of the carbonaceous substrates I to V in the condition in which diamond particles have not been affixed, when they are exposed to the above-described conditions of the hot filament CVD method. When the carbonaceous substrate has a smaller crystallite size as determined from a diffraction line at a lower angle than about 26°, the weight decrease of the carbonaceous substrate is greater. This indicates that the crystallite edge face with high reactivity easily reacts with hydrogen radicals, and the resulting carbonaceous substrate is more easily etched by a hydrogen gas.

Example 1

A carbon material fabricated in the manner described in the above-described embodiment was used in this example.

The carbon material fabricated in this manner is hereinafter referred to as a present invention material A1.

The carbonaceous substrate used is the carbonaceous substrate I, which is most likely to be etched.

Example 2

A carbon material was fabricated in the same manner as described in Example 1 above, except that the diamond particles were affixed to the carbonaceous substrate by a spraying method.

The carbon material fabricated in this manner is hereinafter referred to as a present invention material A2.

The diamond particle density in the substrate surface was $5.7 \times 10^{-4}$ g/cm$^2$ when the diamond particles were affixed to the carbonaceous substrate.

The resultant diamond thin film was analyzed by Raman spectrometry. As a result, it was observed that a peak originating from diamond was observed at 1333 cm$^{-1}$. In addition, the resultant diamond thin film was observed by SEM. As a result, it was found that the substrate surface was covered with the diamond thin film, and that the diamond thin film was a polycrystalline film comprising diamond particles having automorphism with a particle size of about 1 µm.

Example 3

A carbon material was fabricated in the same manner as described in Example 1 above, except that the concentration of the diamond particles in the ethanol solution was set to 2.0 wt. %.

The carbon material fabricated in this manner is hereinafter referred to as a present invention material A3.

The diamond particle density in the substrate surface was $6.0 \times 10^{-4}$ g/cm$^2$ when the diamond particles were affixed to the carbonaceous substrate.

Example 4

A carbon material was fabricated in the same manner as described in Example 1 above, except that the concentration of the diamond particles in the ethanol solution was set to 0.05 wt. %.

The carbon material fabricated in this manner is hereinafter referred to as a present invention material A4.

The diamond particle density in the substrate surface was $1.1 \times 10^{-4}$ g/cm$^2$ when the diamond particles were affixed to the carbonaceous substrate.

Example 5

A carbon material was fabricated in the same manner as described in Example 1 above, except that the concentration of the diamond particles in the ethanol solution was set to 5.0 wt. % and that the diamond particles were affixed to the carbonaceous substrate by a spraying method.

The carbon material fabricated in this manner is hereinafter referred to as a present invention material B1.

The diamond particle density in the substrate surface was $2.3 \times 10^{-4}$ g/cm$^2$ when the diamond particles were affixed to the carbonaceous substrate.

Comparative Example 1

A carbon material was fabricated in the same manner as described in Example 1 above, except that no diamond particle was affixed to the substrate.

The carbon material fabricated in this manner is hereinafter referred to as a comparative material Z1.

Comparative Example 2

A carbon material was fabricated in the same manner as described in Example 1 above, except that the concentration of the diamond particles in the ethanol solution was set to 0.01 wt. %.

The carbon material fabricated in this manner is hereinafter referred to as a comparative material Z2.

The diamond particle density in the substrate surface was $1.0 \times 10^{-5}$ g/cm$^2$ when the diamond particles were affixed to the carbonaceous substrate.

Comparative Example 3

A carbon material was fabricated in the same manner as described in Example 1 above, except that the concentration of the diamond particles in the ethanol solution was set to 0.01 wt. %.

The carbon material fabricated in this manner is hereinafter referred to as a comparative material Z3.

The diamond particle density in the substrate surface was $2.0 \times 10^{-5}$ g/cm$^2$ when the diamond particles were affixed to the carbonaceous substrate.

Comparative Example 4

A carbon material was fabricated in the same manner as described in Example 1 above, except that the concentration of the diamond particles in the ethanol solution was set to 5.0 wt. %.

The carbon material fabricated in this manner is hereinafter referred to as a comparative material Z4.

The diamond particle density in the substrate surface was $3.0 \times 10^{-3}$ g/cm$^2$ when the diamond particles were affixed to the carbonaceous substrate.

Comparative Example 5

A carbon material was fabricated in the same manner as described in Example 1 above, except that the concentration of the diamond particles in the ethanol solution was set to 10.0 wt. %.

The carbon material fabricated in this manner is hereinafter referred to as a comparative material Z5.

The diamond particle density in the substrate surface was $6.0 \times 10^{-3}$ g/cm$^2$ when the diamond particles were affixed to the carbonaceous substrate.

[Experiment 1]

The quality of the diamond thin film and the substrate weight change were determined for the present invention materials A1 to A4 and B1 as well as the comparative materials Z1 to Z5. The results are shown in Table 2 and FIG. 2.

TABLE 2

| Material | Substrate | Seed crystal concentration in aqueous solution (wt. %) | Seed crystal amount in substrate surface (g/cm$^2$) | Weight change before and after the synthesis (%) | Peeling |
|---|---|---|---|---|---|
| Comparative material Z1 | Substrate I | 0 | 0 | −3.81 | Observed |
| Comparative material Z2 | | 0.01 | 1.0E−5 | −1.26 | |
| Comparative material Z3 | | 0.01 | 2.0E−5 | −0.28 | |
| Present invention material A4 | | 0.05 | 1.1E−4 | −0.09 | Not observed |
| Present invention material A1 | | 1.0 | 2.3E−4 | 0.10 | |
| Present invention material A2 | | 1.0 | 5.7E−4 | 0.01 | |
| Present invention material A3 | | 2.0 | 6.0E−4 | 0.12 | |
| Comparative material Z4 | | 5.0 | 3.0E−3 | 0.12 | Observed |
| Comparative material Z5 | | 10.0 | 6.0E−3 | 0.15 | |
| Present invention material B1 | Substrate V | 5.0 | 2.3E−4 | 0.13 | Not observed |

Figure 2:
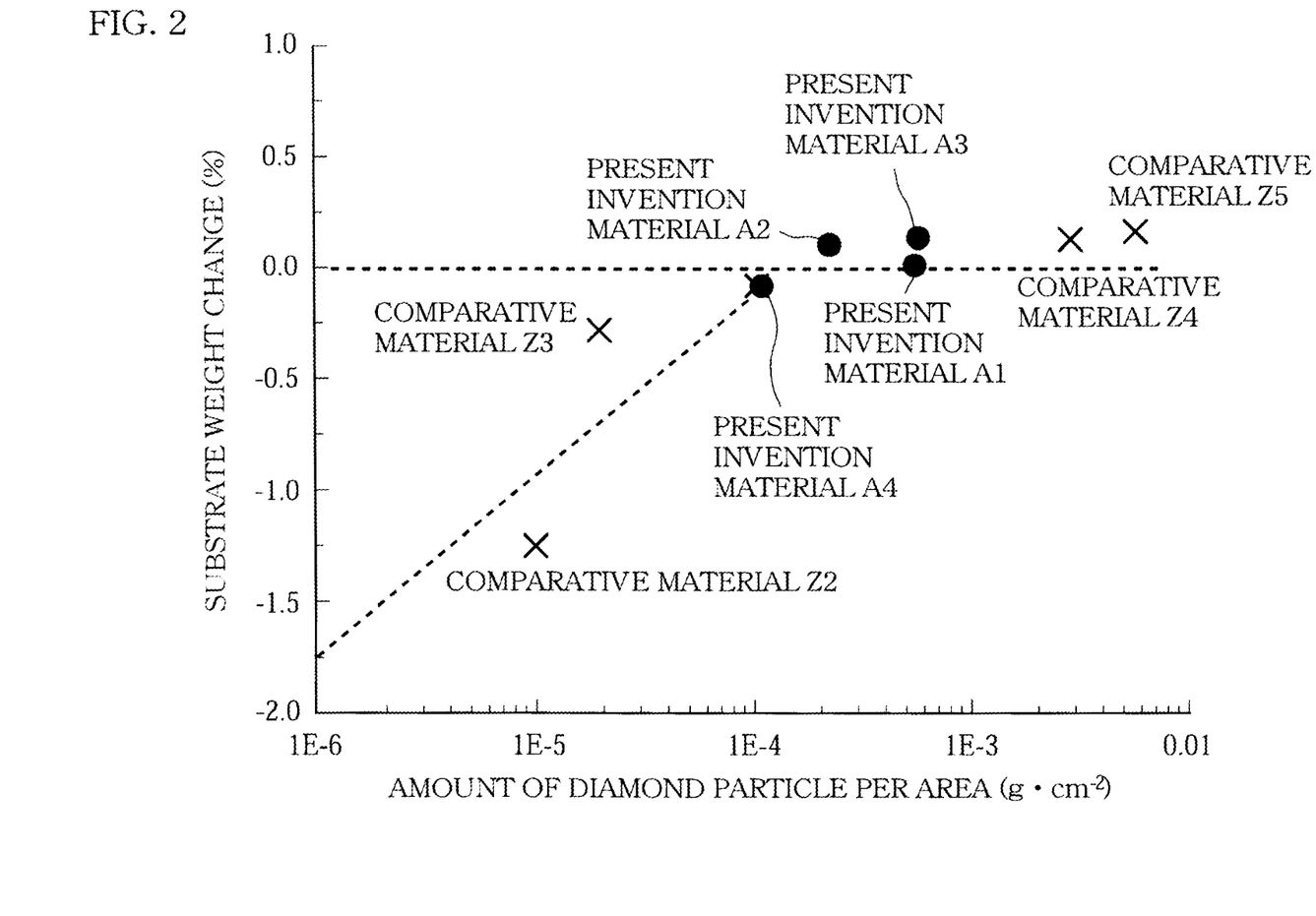
FIG. 2 is a graph showing the relationship between the weight of diamond particles per unit area and the substrate weight change before and after the formation of the diamond thin film.

As clearly seen from Table 2 and FIG. 2, it is observed that, for the comparative materials Z1, Z2, and Z3, the diamond layer peeled at the interface with the substrate, and the substrate weight after the formation of the diamond layer decreased from that before the formation. For the comparative materials Z4 and Z5, it is observed that, although the substrate weight after the formation of the diamond layer increased from that before the formation, the diamond layer peeled at the interface with the substrate.

In contrast, for the present invention material A1, A2, and A3, it is observed that the substrate weight after the formation of the diamond layer increased from that before the formation, and moreover, the diamond layer did not peel at the interface with the substrate. For the present invention material A4, it is observed that, although the substrate weight after the formation of the diamond layer slightly decreased from that before the formation, the diamond layer did not peel at the interface with the substrate.

Also for the present invention material B1, which was fabricated using the substrate V, the one most unlikely to be adversely affected by the etching caused by hydrogen radicals, it is observed that the substrate weight after the formation of the diamond layer increased from that before the formation, and moreover, the diamond layer did not peel at the interface with the substrate.

[Experiment 2]

In fabricating the present invention material A1, the methane gas and the trimethylboron gas were introduced by varying the ratio of B [boron]/C [carbon] (hereinafter referred to as the B/C ratio), and the resistance of each of the fabricated carbon materials was determined. The results are shown in FIG. 3.

Figure 3:
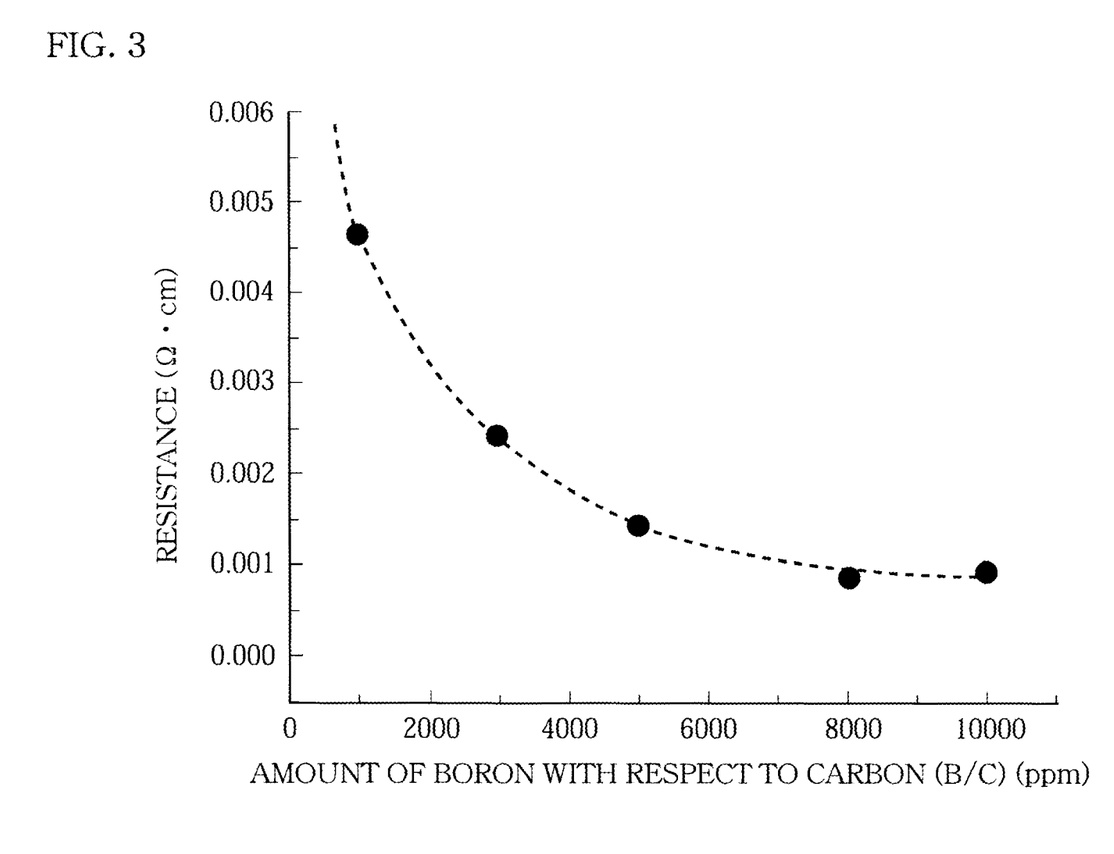
FIG. 3 is a graph showing the relationship between the charge amount of boron source gas with respect to carbon source gas during the diamond thin film formation and the electrical resistance of the formed diamond thin film.

As clearly seen from FIG. 3, the amount of boron is almost saturated when the B/C ratio is 10000 ppm. Therefore, if boron is added in an amount greater than that, it is not expected to reduce the resistance significantly as long as boron is added in an extremely large amount. In addition, even when the B/C ratio is 10000 ppm, the crystallinity of diamond is somewhat hindered. Therefore, when the B/C ratio becomes greater than 10000 ppm, the formation of the diamond layer by crystal growth can be hindered considerably. For these reasons, it is desirable that the B/C ratio be 10000 ppm or less (the resistance is 0.001 Ωcm or higher).

[Experiment 3]

The above-described present invention materials A1 and A2 were used as electrolytic electrodes for fluorine generation to study their electrode performance. The results are described below.

In the experiment, each of the present invention materials A1 and A2 was used as an anode in a KF-2HF-based molten salt immediately after the initial makeup of the electrolytic bath, and a nickel plate was attached thereto as a cathode. Then, constant current electrolysis was carried out at a current density of 20 A/dm$^2$.

As a result, 24 hours after the starting of the electrolysis, the bath voltage was 5.6 V. Then, the electrolysis was continued, and after further 24 hours, the bath voltage was 5.6 V. Thus, it is observed that the bath voltage does not change over time. In addition, the gas generated at the anode was analyzed after the 48 hours, and it was found that the generated gas was $F_2$, and that the generation efficiency was 98%.

INDUSTRIAL APPLICABILITY

The present invention provides a carbon material to which the characteristics of diamond or electrically conductive diamond. It can be used for electrolytic electrodes for fluorine generation, workpieces for electrical discharge machining, and heat sink materials utilizing heat conduction and insulation.

The invention claimed is:

1. A carbon material consisting essentially of:
   a carbonaceous substrate,
   diamond particles disposed on a surface of the carbonaceous substrate, and
   a diamond layer consisting essentially of the diamond particles as seeds, at least one electrical conductivity-imparting element, and a diamond thin film characterized in that:
   the weight of the diamond particles per unit area is from $1.0 \times 10^{-4}$ g/cm$^2$ to less than $3.0 \times 10^{-3}$ g/cm$^2$, wherein
   the at least one electrical conductivity-imparting element is selected from the group consisting of nitrogen, boron, and phosphorus;
   the diamond layer has an electrical resistance of $1 \times 10^{-3}$ Ω·cm or higher and less than $5 \times 10^{-3}$ Ω·cm;
   the diamond layer is formed by crystal growth by chemical vapor deposition with the diamond particles as seeds uniformly disposed on the surface of the carbonaceous substrate; and
   the diamond layer is a polycrystalline film containing a diamond thin film covering the surface of the carbonaceous substrate and
   the diamond particles have automorphism.

2. The carbon material according to claim 1, wherein the weight of the diamond particles per unit area is equal to or greater than $2.3 \times 10^{-4}$ g/cm$^2$.

3. The carbon material according to claim 1, wherein the diamond particles have crystallinity, a lattice constant of 0.36 nm or less as determined by XRD, and a cluster distribution of from 0.003 μm to 10 μm.

4. The carbon material according to claim 2, wherein the diamond particles have crystallinity, a lattice constant of 0.36 nm or less as determined by XRD, and a cluster distribution of from 0.003 μm to 10 μm.

5. The carbon material according to claim 1, wherein the carbonaceous substrate shows a weight decrease of 4.0% or less when solid in a diamond synthesis atmosphere.

6. The carbon material according to claim 2, wherein the carbonaceous substrate shows a weight decrease of 4.0% or less when solid in a diamond synthesis atmosphere.

7. The carbon material according to claim 3, wherein the carbonaceous substrate shows a weight decrease of 4.0% or less when solid in a diamond synthesis atmosphere.

8. The carbon material according to claim 4, wherein the carbonaceous substrate shows a weight decrease of 4.0% or less when solid in a diamond synthesis atmosphere.

9. The carbon material according to claim 1, wherein:
   the carbonaceous substrate comprises a carbonaceous substance comprising a unary or binary source material;
   the carbonaceous substrate has an X-ray diffraction pattern such that (002) diffraction line shapes appearing at 2θ=10° to 30° are asymmetrical; and
   the (002) diffraction line shapes have a two-line component pattern having at least two diffraction lines at about 2θ=26° and at a lower angle than about 26°.

10. The carbon material according to claim 2, wherein:
    the carbonaceous substrate comprises a carbonaceous substance comprising a unary or binary source material;
    the carbonaceous substrate has an X-ray diffraction pattern such that (002) diffraction line shapes appearing at 2θ=10° to 30° are asymmetrical; and
    the (002) diffraction line shapes have a two-line component pattern having at least two diffraction lines at about 2θ=26° and at a lower angle than about 26°.

11. The carbon material according to claim 3, wherein:
    the carbonaceous substrate comprises a carbonaceous substance comprising a unary or binary source material;
    the carbonaceous substrate has an X-ray diffraction pattern such that (002) diffraction line shapes appearing at 2θ=10° to 30° are asymmetrical; and
    the (002) diffraction line shapes have a two-line component pattern having at least two diffraction lines at about 2θ=26° and at a lower angle than about 26°.

12. The carbon material according to claim 4, wherein:
    the carbonaceous substrate comprises a carbonaceous substance comprising a unary or binary source material;
    the carbonaceous substrate has an X-ray diffraction pattern such that (002) diffraction line shapes appearing at 2θ=10° to 30° are asymmetrical; and
    the (002) diffraction line shapes have a two-line component pattern having at least two diffraction lines at about 2θ=26° and at a lower angle than about 26°.

13. The carbon material according to claim 9, wherein the carbonaceous substrate has a crystallite size of from 2 nm to 32 nm as determined from the diffraction line at a lower angle than about 26°.

14. The carbon material according to claim 10, wherein the carbonaceous substrate has a crystallite size of from 2 nm to 32 nm as determined from the diffraction line at a lower angle than about 26°.

15. The carbon material according to claim 11, wherein the carbonaceous substrate has a crystallite size of from 2 nm to 32 nm as determined from the diffraction line at a lower angle than about 26°.

16. The carbon material according to claim 12, wherein the carbonaceous substrate has a crystallite size of from 2 nm to 32 nm as determined from the diffraction line at a lower angle than about 26°.

* * * * *